Figures 1, 2, 2A, 3:
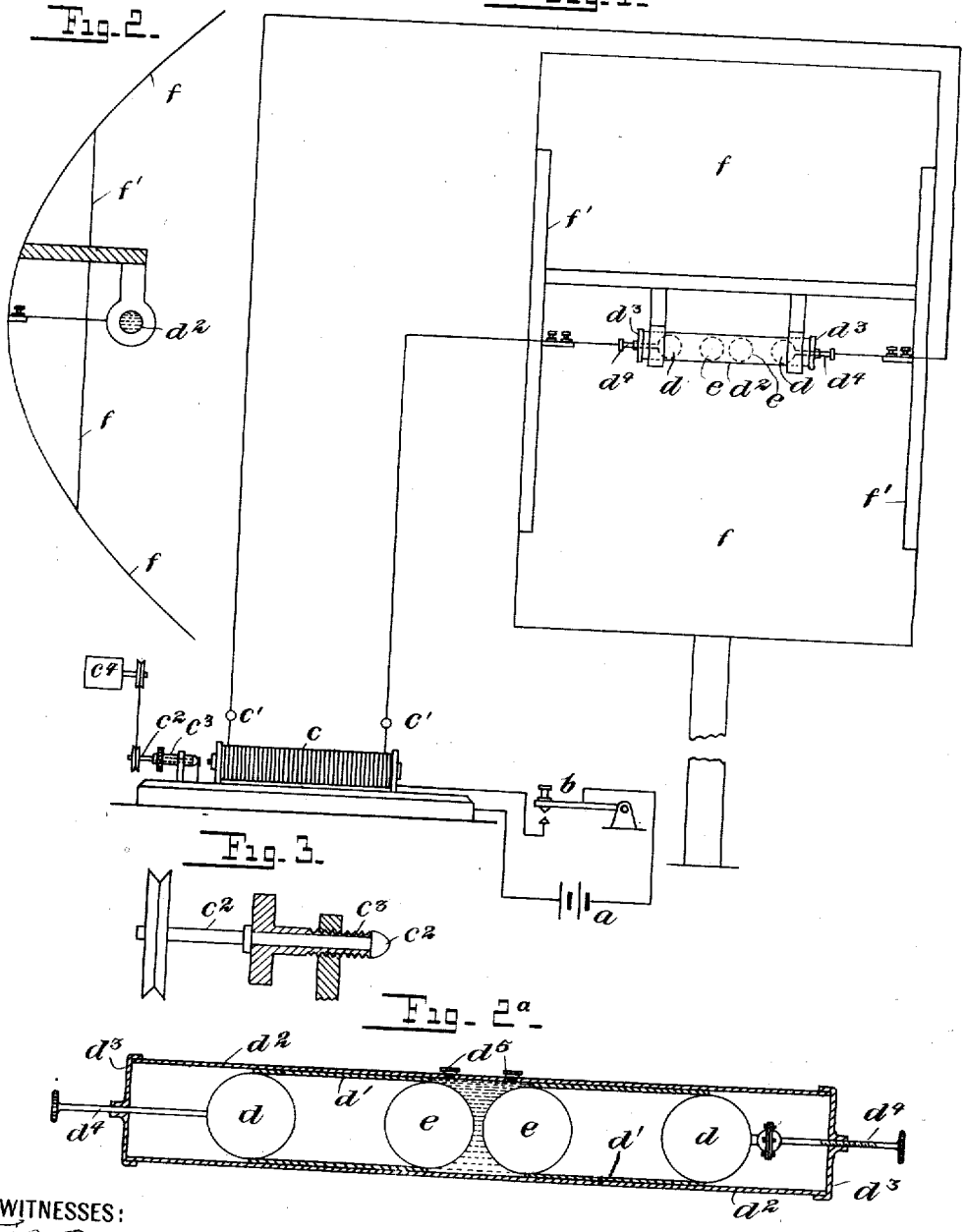

No. 11,913.

G. MARCONI.

Reissued June 4, 1901.

TRANSMITTING ELECTRICAL IMPULSES AND SIGNALS AND APPARATUS THEREFOR.

(Application filed Apr. 1, 1901.)

3 Sheets—Sheet 1.

WITNESSES:

F. N. Roehrich

Geo. H. Berrigan Jr.

INVENTOR,

Guglielmo Marconi,

BY

Betts, Betts, Sheffield & Betts

ATTORNEYS.

No. 11,913.

Reissued June 4, 1901.

G. MARCONI.

TRANSMITTING ELECTRICAL IMPULSES AND SIGNALS AND APPARATUS THEREFOR.

(Application filed Apr. 1, 1901.)

3 Sheets—Sheet 2.

WITNESSES:

F. N. Roehrich

H. H. Berrigan Jr.

INVENTOR

Guglielmo Marconi,

BY

Betts, Betts, Shepherd & Betts

ATTORNEYS.

No. 11,913.

Reissued June 4, 1901.

G. MARCONI.

TRANSMITTING ELECTRICAL IMPULSES AND SIGNALS AND APPARATUS THEREFOR.

(Application filed Apr. 1, 1901.)

3 Sheets—Sheet 3.

WITNESSES:

F. N. Roehrick

W. H. Berrigan Jr.

INVENTOR

Guglielmo Marconi,

BY

Betts, Betts, Hoffman & Betts

ATTORNEYS.

UNITED STATES PATENT OFFICE.

GUGLIELMO MARCONI, OF LONDON, ENGLAND, ASSIGNOR, BY MESNE ASSIGNMENTS, TO MARCONI'S WIRELESS TELEGRAPH COMPANY, LIMITED, OF ENGLAND.

TRANSMITTING ELECTRICAL IMPULSES AND SIGNALS AND APPARATUS THEREFOR.

SPECIFICATION forming part of Reissued Letters Patent No. 11,913, dated June 4, 1901.

Original No. 586,193, dated July 13, 1897. Application for reissue filed April 1, 1901. Serial No. 53,896.

*To all whom it may concern:*

Be it known that I, GUGLIELMO MARCONI, a subject of the King of Italy, residing and having a post-office address at 18 Finch Lane, Threadneedle street, London, England, have invented certain new and useful Improvements in Transmitting Electrical Impulses and Signals and in Apparatus Therefor, of which the following is a specification.

According to this invention electrical signals, actions, or manifestations are transmitted (through the air, earth, or water) by means of oscillations of high frequency, such as have been called "Hertz rays" or "Hertz oscillations." All line-wires may be dispensed with. At the transmitting-station I preferably employ a Ruhmkorff coil having in its primary circuit a Morse key or other signaling instrument and at its poles appliances for producing the desired oscillations. The Ruhmkorff coil may, however, be replaced by any other source of high-tension electricity. When working with large amounts of energy, it is, however, better to keep the coil or transformer constantly working for the time during which one is transmitting, and instead of interrupting the current of the primary interrupting the discharge of the secondary. In this case the contacts of the key should be immersed in oil, as otherwise, owing to the length of the spark, the current will continue to pass after the contacts have been separated. At the receiving-station there is a local-battery circuit containing any ordinary receiving instrument and an appliance for closing the circuit, the latter being actuated by the oscillations from the transmitting-station. When transmitting through the air, and it is desired that the signal should only be sent in one direction, I place the oscillation-producer at the transmitting-station in the focus or focal line of a reflector directed to a receiving-station, and I place the circuit-closer at the receiving-station in a similar reflector directed toward the transmitting-station. When transmitting signals by the aid of earth connections, I connect one end of the oscillation-producer and one end of the circuit-closer to earth and the other ends to plates preferably electrically tuned with each other in the air and insulated from earth.

Figure 4:
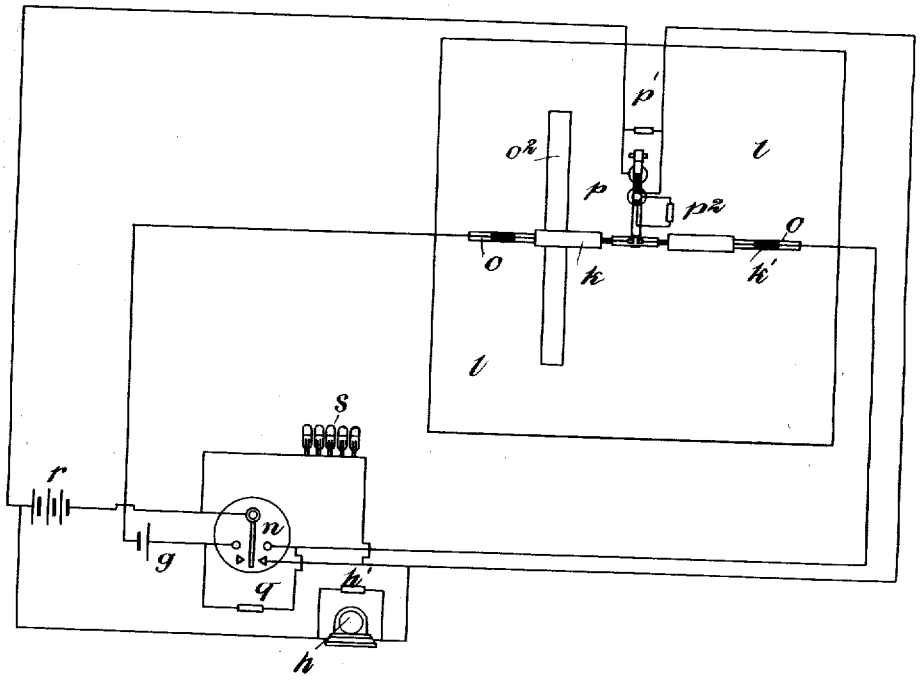
Figure 5:
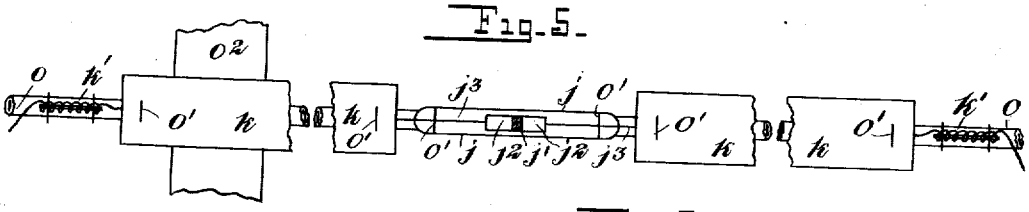
Figure 6:
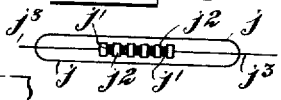
Figure 7:
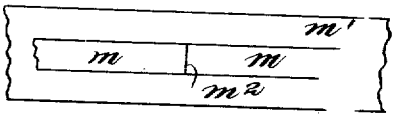
Figure 8:
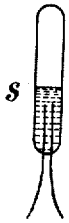
Figure 9:
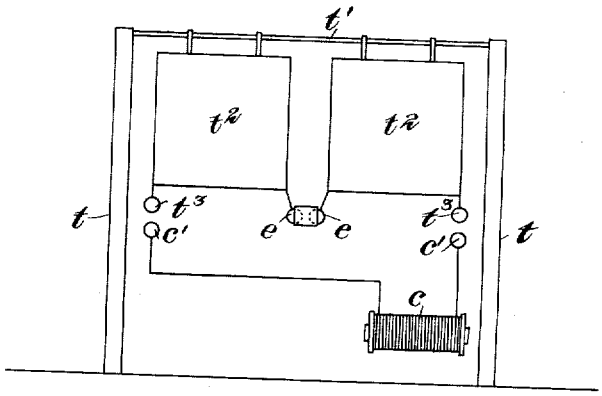
Figure 10:
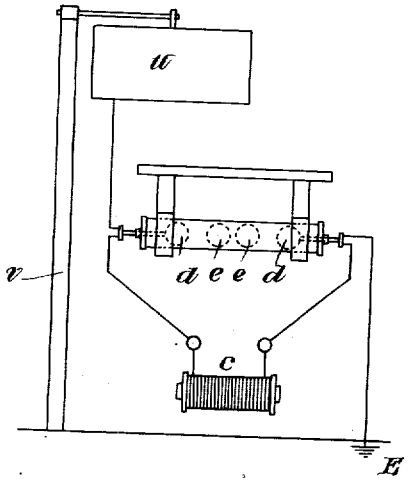
Figure 11:
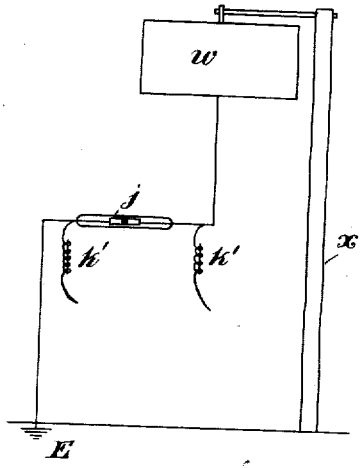

Figure 1 is a diagrammatic front elevation of the instruments at the transmitting-station when signaling through the air, and Fig. 2 is a vertical section of the transmitter. Fig. $2^a$ is a longitudinal section of the oscillator to a larger scale. Fig. 3 shows a detail of the trembler-break on a larger scale. Fig. 4 is a diagrammatic front elevation of the instruments at the receiving-station. Fig. 5 is an enlarged view of the receiver. Fig. 6 shows a modification of the tube *j*. Fig. 7 shows the detector. Fig. 8 is a full-sized view of the liquid resistance. Figs. 9 and 10 show modifications of the arrangements at the transmitting-station. Fig. 11 shows a modification of the arrangements at the receiving-station.

Referring now to Fig. 1, *a* is a battery, and *b* an ordinary Morse key closing the circuit through the primary of a Ruhmkorff coil *c*. The terminals *c'* of the secondary circuit of the coil are connected to two metallic balls *d d*, fixed by heat or otherwise at the ends of tubes *d' d'*, Fig. $2^a$, of insulating material, such as ebonite or vulcanite. *e e* are similar balls fixed in the other ends of the tubes *d'*. The tubes *d'* fit tightly in a similar tube $d^2$, having covers $d^3$, through which pass rods $d^4$, connecting the balls *d* to the conductors. One (or both) of the rods $d^4$ is connected to the ball *d* by a ball-and-socket joint and has a screw-head upon it working in a nut in the cover $d^3$. By turning the rod, therefore, the distance of the balls *e* apart can be adjusted. $d^5$ represents holes in the tube $d^2$, through which vaseline, oil, or like material is introduced into the space between the balls *e*.

The balls *d* and *e* are preferably of solid brass or copper, and the distance they should be apart depends on the quantity and electromotive force of the electricity employed, the effect increasing with the distance so long as the discharge passes freely. With a coil giving an ordinary eight-inch spark, the distance between *e* and *e* should, to assure good results, be from one twenty-fifth to one-thirtieth of an inch and the distance between *d* and

*e* about one and one-half inches. Other conditions being equal, the larger the balls the greater is the distance at which it is possible to communicate. I have generally used balls of solid brass of four inches diameter, giving oscillations of ten inches length of wave.

If a very powerful source of electricity giving a very long spark be employed, it is preferable to divide the spark-gap between the central balls of the oscillator into several smaller gaps in series. This may be done by introducing between the big balls smaller ones of about half an inch diameter, held in position by ebonite frames.

I find that the regularity and power of the discharge of an ordinary Ruhmkorff coil with a trembler-break on its primary is greatly improved by causing one of the contacts of the vibrating break to revolve rapidly. I do this preferably by having a revoluble central core $c^2$, Fig. 3, in an ordinary screw $c^3$, which is in communication with platinum contacts. I cause the said central core, with one of the platinum contacts attached to it, to revolve, preferably, by connecting it to a small electric motor $c^4$. This motor can be worked by the same circuit that works the coil or, if necessary, by a separate circuit. The connections are not shown in the drawings. By this means the platinums are kept smooth and any tendency to stick is removed. They last, also, much longer. At the receiving-station is a battery whose circuit includes an ordinary telegraphic instrument (or it may be a relay or other apparatus which it is desired to work from a distance) and a circuit-closer.

In Fig. 4, *g* is the battery, and *h* a telegraphic instrument on the derived circuit of a relay *n*.

The appliance I employ as a circuit-closer is shown at Fig. 5, and consists of a glass tube *j*, containing metallic powder or grains of metal *j'*, each end of the column of powder being connected to a metallic plate *k* of suitable length to cause the system to resonate electrically in unison with the electrical oscillations transmitted. The glass tube may be replaced in some places by one of gutta-percha or like material. Two short pieces $j^2$, preferably of thick silver wire of the same diameter as the internal diameter of the tube *j*, so as to fit tightly in it, are joined to two pieces of platinum wire $j^3$. The tube is closed and sealed onto the platinum wires $j^3$ at both ends.

Many metals can be employed for producing the powder or filings *j'*; but I prefer to use a mixture of two or more different metals. I find hard nickel to be the best metal, and I prefer to add to the nickel filings about ten per cent. of hard-silver filings, which increase greatly the sensitiveness of the tube to electric oscillations. By increasing the proportion of silver powder or grains the sensitiveness of the tube also increases; but it is better for ordinary work not to have a tube of too great sensitiveness, as it might be influenced by atmospheric or other electricity. The sensitiveness can also be increased by adding a very small amount of mercury to the filings and mixing up until the mercury is absorbed.

The mercury must not be in such a quantity as to clot or cake the filings. An almost imperceptible globule is sufficient for a tube. Instead of mixing the mercury with the powder one can obtain the same effects by slightly amalgamating the inner surfaces of the plugs which are to be in contact with the filings. Very little mercury must be used, just sufficient to brighten the surface of the metallic plugs without showing any free globules. The size of the tube and the distance between the two metallic stops may vary under certain limits. The greater the space allowed for the powder the larger and coarser ought to be the filings or grains.

I prefer to make my sensitive tubes of the following size: The tube *j* is one and one-half inches long and one-tenth or one-twelfth of an inch in internal diameter. The length of the stops $j^2$ is about one-fifth of an inch, and the distance between the stops is about one-thirtieth of an inch. I find that the smaller the space between the stops in the tube the more sensitive it proves; but the space cannot under ordinary circumstances be excessively shortened without injuring the fidelity of the transmission.

The metallic powders ought not to be fine, but, rather, as coarse as can be produced by a large and rough file.

All the very fine powder ought to be removed by blowing or sifting.

The powder ought not to be compressed between the stops, but, rather, loose and in such a condition that when the tube is tapped the powder may be seen to move.

The tube must be sealed; but a vacuum inside it is not essential. A slight vacuum, however, results from having heated it while sealing it. Care must also be taken not to heat the tube too much in the center when sealing it, as it would oxidize the surfaces of the silver stops and also the powder, which would diminish its sensitiveness. I use in sealing the tubes a hydrogen and air flame. A vacuum is, however, desirable, and I have used one of about one one-thousandth of an atmosphere, obtained by a mercury-pump. It is also necessary for the powder or grains to be dry and free from grease or dirt, and the files used in producing the same ought to be frequently washed and dried and used when warm.

If the tube has been well made, it should be sensitive to the induction of an ordinary electric bell when the same is working at one to two yards or more from the tube.

In order to keep the sensitive tube *j* in good working order, it is desirable, but not absolutely necessary, not to allow more than one milliampere to flow through it when active. If a stronger current is necessary, several tubes may be put in derivation between the tuned plates; but this arrangement is not quite as satisfactory as the single tube. It is necessary when using tubes of the type I have described not to insert in the circuit more than one coil of the Leclanche type, as a higher electromotive force than 1.5 volts is apt to pass a current through the tube even when no oscillations are transmitted. I can, however, construct tubes capable of working with a much higher electromotive force. Fig. 6 shows one of these tubes. In this tube instead of one space or gap filled with filings there are several spaces separated by sections of tight-fitting silver wire. A tube thus constructed, observing also the rules of construction of my tubes in general, will work satisfactorily if the electromotive force of the battery in circuit with the tube is equal to 1.2 volts multiplied by the number of gaps. With this tube, also, it is well not to allow a current of more than one milliampere to pass.

The tube *j* may be replaced by other forms of imperfect electrical contacts.

The plates *k* are of copper or aluminium or other metal, about half an inch or more broad, about one-fiftieth of an inch thick, and preferably of such a length as to be electrically tuned with the electric oscillations transmitted. The means I adopt for fixing the length of the plates is as follows: I stick a rectangular strip of tin-foil *m* (see Fig. 7) about twenty inches long, (the length depends on the supposed length of wave that one is measuring,) by means of a weak solution of gum, onto a glass plate *m'*. Then by means of a very sharp penknife or point I cut across the middle of the tin-foil, leaving a mark of division $m^2$. If this detector is held in the proximity (four or five yards) and parallel with the axis of the oscillator in action it will show little sparks at $m^2$. If the length of the pieces of tin-foil approximates to the length of wave emitted from the oscillator, the spark will take place between them at a certain distance from the transmitter, which is a maximum when they are of suitable length. By shortening or lengthening the strips, therefore, it is easy to find the length most appropriate to the length of wave emitted by the oscillator. It is desirable to try this detector in the focus or focal line of the reflector. The length so found is the proper length for the plates *k*, or rather these should be about half an inch shorter on account of the length of the sensitive tube *j*, connected between them.

Instead of the tuned plates *k* tubes or even wires may be employed.

*f* is a cylindrical parabolic reflector made by bending a metallic sheet, preferably of brass or copper, to form and fixing it to metallic or wooden ribs *f'*.

*l* is a cylindrical parabolic reflector similar to that used at the transmitting-station.

The reflectors applied to the receiver and transmitter ought to be, preferably, in length and opening the double at least of the length of wave emitted from the oscillator.

It is slightly advantageous for the focal distance of the reflector at the receiving-station to be equal to one-fourth or three-fourths of the wave length of the oscillation transmitted.

I have hitherto only mentioned the use of cylindrical reflectors; but it is also possible to use ordinary concave reflectors, preferably parabolic, such as are used for projectors.

It is not essential to have a reflector at the transmitters and receivers; but in their absence the distance at which one can communicate is much smaller.

When no oscillations are sent from the transmitting-station, the tube *j* does not conduct the current and the local-battery circuit is broken; but when the powder or tube is influenced by the electrical oscillations from the transmitter it conducts and closes the circuit. I find, however, that when once started the powder in the tube continues to conduct even when the oscillations from the transmitter have ceased; but if it be shaken or tapped the circuit is broken. A tube well prepared will instantly interrupt the current passing through it at the slightest tap, provided it is inserted in a circuit in which there is little self-induction and small electromotive force, such as a single cell, and where the effects of self-induction have been removed by one of the methods which I will presently describe.

The two plates *k* communicate with the local circuit through two very small coils *k'*, which I will call "choking-coils," formed by winding a few inches of very thin and insulated copper wire around a bit of iron wire about an inch and a half long. The object of these choking-coils is to prevent the high-frequency oscillation induced across these plates by the transmitter from dissipating itself by running along the local-battery wires, which might weaken its effect on the sensitive tube *j*. These choking-coils may, however, be sometimes replaced by simple thin wires. They may also be connected directly to the tube *j*. The local circuit in which the sensitive tube *j* is inserted contains a sensitive relay *n*, preferably wound to a resistance of about twelve hundred ohms. This resistance need not be necessarily that of the relay, but may be the sum of the resistance of the relay and another additional resistance. The relay ought to be one possessing small self-induction.

The plates *k*, tube *j*, and coils *k'* are fastened by means of wire stitches *o'* to a thin glass tube *o*, preferably not longer than twelve inches, firmly fixed at one end to a strong piece of timber $o^2$. This may be done by means of wood or ebonite grasping-screws.

I do the tapping automatically by the current started by the tube, employing a trembler *p* on the circuit of the relay *n* similar in construction to that of an electric bell, but having a shorter arm. This vibrator must be carefully adjusted. Preferably the blows should be directed slightly upward to prevent the filings from getting caked. In place of tapping the tube, the powder can be disturbed by slightly moving outward and inward one or both of the stops $j^2$, the trembler $p$ being replaced by a small electromagnet (or magnets) whose armature is connected to the stop.

I ordinarily work the telegraphic receiver $h$ (or other instruments) by a derivation, as shown, from the circuit which works the trembler $p$. They can also, however, be worked in series with the trembler. When working ordinary sounders or Morse apparatus, a special adjustment of the same is sometimes needed to enable one to obtain dots and dashes. Sometimes it is necessary to work the telegraphic instruments or relays from the back stops of the first relay, as is done in some systems of multiple telegraphy. Such adjustments are known to telegraphic experts.

By means of a tube with multiple gaps it is possible to work the trembler and also the signaling or other apparatus direct on the circuit which contains the tube; but I prefer, when possible, to work with the single-gap tube and the relay, as shown. With a sensitive and well-constructed trembler it is also possible to work the trembler with the single-gap tube in series with it without the relay.

In derivation on the terminals of the relay $n$ is placed an ordinary platinoid resistance double-wound (or wound on the "bight," as it is sometimes termed) coil $q$ of about four times the resistance of the relay, which prevents the self-induction of the winding of the relay from affecting the sensitive tube.

The circuit actuated by the relay contains an ordinary battery $r$ of about twelve cells and the trembler $p$, the resistance of the winding of which should be about one thousand ohms, and the core ought preferably to be of soft iron, hollow and split lengthwise, like most electromagnets used in telegraph instruments. In series or derivation from this circuit is inserted the telegraphic or other apparatus $h$ which one may desire to work. It is desirable that this instrument or apparatus if on a derivation should have a resistance equal to the resistance of the trembler $p$. A platinoid resistance $h'$ of about five times the resistance of the instrument is inserted in derivation across the terminals of the instrument and connected as close to the same as possible. In derivation across the terminals of the trembler $p$ is placed another platinoid resistance $p'$, also of about five times the resistance of the trembler. A similar resistance $p^2$ is inserted in a circuit connecting the vibrating contacts of the trembler. In derivation across the terminals of the relay-circuit it is well to have a liquid resistance $s$, which is constituted of a series of tubes, one of which is shown full size in Fig. 8 filled with water acidulated with sulfuric acid. The number of these tubes in series across the said terminals ought to be about ten for a circuit of fifteen volts, so as to prevent, in consequence of their counter electromotive force, the current of the local battery from passing through them, but allowing the high-tension jerk of current generated at the opening of the circuit in the relay to pass smoothly across them without producing perturbing sparks at the movable contact of the relay. It is also necessary to insert a platinoid resistance in derivation on any apparatus one may be working on the local circuits. These resistances ought also to be inserted in derivation on the terminals of any resistance which may be apt to give self-induction.

I find it convenient when transmitting across long distances to make use of the transmitter shown in Fig. 9.

$t$ $t$ are two poles connected by a rope $t'$, to which are suspended, by means of insulating-suspenders, two metallic plates $t^2$ $t^2$, preferably in the form of cylinders closed at the top, connected to the spheres $e$ (in oil or other dielectric, as before) and to the other balls $t^3$ in proximity to the spheres $c'$, in communication with the coil or transformer $c$. The balls $t^3$ are not absolutely necessary, as the plates $t^2$ may be made to communicate with the coil or transformer by means of thin insulated wires. The receiver I adopt with this transmitter is similar to it, except that the spheres $e$ are replaced by the sensitive tube $j$ and plates $k$, while the spheres $t^3$ are replaced by the choking-coils $k'$, in communication with the local circuit. It may be observed that, other conditions being equal, the larger the plates at the transmitter and receiver and the higher they are from the earth and to a certain extent the farther apart they are the greater is the distance at which correspondence is possible.

When transmitting with connections to the earth or water, I use a transmitter as shown in Fig. 10. I connect one of the spheres $d$ to earth E, preferably by thick wire, and the other to a plate or elevated conductor $u$, carried by a pole $v$ and insulated from earth, or the spheres $d$ may be omitted and one of the spheres $e$ be connected to earth and the other to the plate or conductor $u$. At the receiving-station, Fig. 11, I connect one terminal of the sensitive tube $j$ to earth E, also by a thick wire, and the other to a plate or elevated conductor $w$, preferably similar to $u$. The plate $w$ may be suspended on a pole $x$ and must be insulated from earth. The larger the plates of the receiver and transmitter and the higher from the earth the plates are carried the greater is the distance at which it is possible to communicate. When using the last-described apparatus, it is not necessary to have the two instruments in view of each other, as it is of no consequence if they are separated by mountains or other obstacles. At the receiver it is possible to pick up the oscillations from the earth or water without having the plate *w*. This may be done by connecting the terminals of the sensitive tube *j* to two earths preferably at a certain distance from each other and in a line with the direction from which the oscillations are coming. These connections must not be entirely conductive, but must contain a condenser of suitable capacity—say one square yard of surface. Balloons can also be used instead of plates on poles provided they carry up a plate or are themselves made conductive by being covered with tin-foil. As the height to which they may be sent is great, the distance at which communication is possible becomes greatly multiplied. Kites may also be successfully employed, if made conductive by means of tin-foil.

The apparatus above described is so sensitive that it is essential either that the transmitters and receivers at each station should be at a considerable distance from each other or that they should be screened from each other by stout metal plates. It is sufficient to have all the telegraphic apparatus in a metal box and any exposed part of the circuit of the receiver inclosed in metallic tubes which are in electrical communication with the box. Of course the part of the apparatus which has to receive the radiation from the distant station must not be inclosed, but possibly screened from the local transmitter by means of metallic sheets. When working through the earth or water, the local receiver must be switched out of circuit when the transmitter is at work, and this may also be done when working through air.

The operation of my apparatus and system of communication or signals is as follows: The Ruhmkorff coil or other source of high tension electrically capable of producing Hertz oscillations being in circuit with a signaling instrument—such as a Morse key, for instance—the operator by closing the circuit in the way commonly employed for producing dots and dashes in ordinary telegraphy will cause the oscillator to produce either a short or a more prolonged electric discharge or spark or succession of sparks, and this will cause a corresponding short or more prolonged oscillation in the surrounding medium corresponding in duration to the short or longer electrical impulse which in ordinary telegraphy produces a dot or dash. Such oscillations of defined character will thereupon be propagated as such throughout the medium and will affect a properly-constructed instrument at a distant receiving-station. At such station the imperfect-contact instrument is in circuit with a relay, and when oscillations from the transmitting-station reach and act upon such imperfect contact its resistance is reduced, and the circuit is thereby closed during the continuance of the oscillation and for a length of time corresponding thereto. The closing of the relay-circuit causes the sounder or other signal apparatus to act in accordance with the particular oscillation received, and the oscillation also immediately starts the action of the shaking or tapping device, which so shakes the powder in the imperfect-contact instrument as to cause it to break circuit as soon as the oscillation ceases which has closed the circuit and produced a movement of the signaling instrument corresponding thereto. I am therefore enabled to communicate signals telegraphically without wires by thus artificially forming oscillations at the transmitting-station into definite signals by means of a signaling instrument and receiving and reading the same at a receiving-station by an imperfect-contact instrument, which when acted upon by such defined oscillations operates, first, to close the circuit in accordance with the received oscillation and produce a corresponding movement of the receiving instrument, relay, or sounder, and also to operate a shaking device to automatically reopen the circuit immediately after the reception of each oscillation, thereby preserving the results of its defined character in the action of the receiver.

All the details specified herein of construction of the sensitive tube and its connections are desirable for great efficiency; but the fundamental features of my system of transmission are not restricted to such details.

I am aware that the sensitiveness of various apparatus, including tubes containing filings, to more or less distant electrical disturbances has been observed in a general way and that it has also been proposed to disturb the conductivity of such filings by various instrumentalities for shaking the tubes containing the same. I am also aware that the use of tubes containing metallic powders of several separate kinds has been described or suggested in connection with certain experiments relating to so-called "coherers," but I am not aware that the utility of a mixture of metallic powders has ever previous to my invention been ascertained and utilized for the purpose of obtaining the required degree of sensitiveness in such an instrument.

I am aware of the publication of Professor Lodge of 1894, at London, England, entitled "*The Work of Hertz*" and the description therein of various instruments in connection with manifestations of Hertz oscillations. I am also aware of the papers by Professor Popof in the *Proceedings of the Physical and Chemical Society of Russia* in 1895 or 1896; but in neither of these is there described a complete system or mechanism capable of artificially producing Hertz oscillations and forming the same into and propagating them as definite signals and capable of receving and reproducing, telegraphically, such definite signals; nor has any system been described, to my knowledge, in which a Hertz oscillator at a transmitting-station and an imperfect-contact instrument at a receiving-station are both arranged with one terminal to earth and the other elevated or insulated; nor am I aware that prior to my invention any practical form of self-recovering imperfect-contact instrument has been described.

I believe that I am the first to discover and use any practical means for effective telegraphic transmission and intelligible reception of signals produced by artificially-formed Hertz oscillations.

What I claim is—

1. In an apparatus for communicating electrical signals by means of a producer of Hertz oscillations, and a signaling instrument, the combination, in the receiver, of an imperfect electrical contact, a circuit through the contact, and a receiving instrument operated by the influence of such oscillations on said contact, substantially as and for the purpose described.

2. In an apparatus for communicating electrical signals by means of a producer of Hertz oscillations and a signaling instrument, the combination, in the receiver, of an imperfect electrical contact, a circuit through the contact, and means, controlled by said circuit, operating to shake the contact, substantially as and for the purpose described.

3. The combination, in an apparatus for communicating electrical signals, of a spark-producer at the transmitting-station, an earth connection to one end of the spark-producer, an insulated conductor connected to the other end, an imperfect electrical contact at the receiving-station, an earth connection to one end of the contact, an insulated conductor connected to the other end, and a circuit through the contact, substantially as and for the purpose described.

4. The combination, in an apparatus for communicating electrical signals, of a spark-producer at the transmitting-station, an earth connection to one end of the spark-producer, an insulated conductor connected to the other end, an imperfect electrical contact at the receiving-station, an earth connection to one end of the contact, an insulated conductor connected to the other end, a circuit through the contact, and means, controlled by the circuit, for shaking the contact, substantially as and for the purpose described.

5. The combination, in an apparatus for communicating electrical signals, of a spark-producer at the transmitting-station, an earth connection to one end of the spark-producer, an insulated conductor connected to the other end, an imperfect electrical contact at the receiving-station, choking-coils connected to each end of the contact, an earth connection to one end of the imperfect contact, an insulated conductor connected to the other end, and a circuit through the coils and contact, substantially as and for the purpose described.

6. The combination, in an apparatus for communicating electrical signals by means of a producer of Hertz oscillations, and a signaling instrument, an imperfect electrical contact at the receiving-station, choking-coils connected to the contact, a circuit through the coils and contact, and means, controlled by the circuit and operating to shake the contact, substantially as and for the purpose described.

7. The combination, in an apparatus for communicating electrical signals by means of a producer of Hertz oscillations and a signaling instrument, an imperfect electrical contact at the receiving-station, means, connected to each end of the contact, to prevent the oscillation from dissipating itself, a circuit through said means and contact, and means controlled by the circuit and operating to shake the contact, substantially as and for the purpose described.

8. The combination, in an apparatus for communicating electrical signals, of a spark-producer at the transmitting-station, an earth connection to one end of the spark-producer, an insulated conductor connected to the other end, a tube containing metallic powder at the receiving-station, an earth connection to the powder and an insulated conductor also connected therewith, and a circuit through the powder, substantially as and for the purpose described.

9. The combination, in an apparatus for communicating electrical signals, of a spark-producer at the transmitting-station, an earth connection to one end of the spark-producer, an insulated conductor connected to the other end, a tube containing metallic powder, and an insulated conductor also connected therewith, a circuit through the powder and means, controlled by the circuit, for shaking the powder, substantially as and for the purpose described.

10. The combination, in an apparatus for communicating electrical signals, of a spark-producer at the transmitting-station, an earth connection to one end of the spark-producer, an insulated conductor connected to the other end, a tube containing metallic powder at the receiving-station, choking-coils connected to the powder, an earth connection to the powder and an insulated conductor also connected therewith, and a circuit through the coils and powder, substantially as and for the purpose described.

11. The combination, in an apparatus for communicating electrical signals, of a producer of Hertz oscillations, electrically connected with a signaling instrument at the transmitting-station, a tube containing metallic powder at the receiving-station, choking-coils connected to the powder, a circuit through the powder, and means, controlled by said circuit, for shaking the powder, substantially as and for the purpose described.

12. The combination, in an apparatus for communicating electrical signals, of a producer of Hertz oscillations, electrically connected with a signaling instrument at the transmitting-station, a tube containing metallic powder at the receiving-station, choking-coils and earth connection through condensers connected to the powder, a circuit through the coils and powder, and means, controlled by the circuit, for shaking the powder, substantially as and for the purpose described.

13. The combination, in an apparatus for communicating electrical signals, of a producer of Hertz oscillations, electrically connected with a signaling instrument at the transmitting-station, a tube containing metallic powder at the receiving-station, electrically-tuned devices connected to the powder, a circuit through the powder, and means, controlled by said circuit, for shaking the powder, substantially as and for the purpose described.

14. In a receiver for electrical oscillations, the combination of an imperfect electrical contact, tuned metallic plates connected to it, a circuit through the contact, and means, controlled by the circuit, for shaking the contact.

15. In a receiver for electrical oscillations, the combination of an imperfect electrical contact, choking-coils connected to the contact, a circuit through the coils and contact, and means, controlled by the circuit, for shaking the contact.

16. In a receiver for electrical oscillations, the combination of an imperfect electrical contact, tuned metallic plates and choking-coils connected to the contact, a circuit through the same, and means, controlled by the circuit, for shaking the contact.

17. In a receiver for electrical oscillations, the combination of a tube containing a mixture of metallic powders, a circuit through the same, and means, controlled by the circuit, for shaking the powder.

18. In a receiver for electrical oscillations, the combination of a tube containing a metallic powder or powders and mercury, a circuit through the same, and means, controlled by the circuit, for shaking the powder.

19. In a receiver for electrical oscillations, the combination of a tube, metallic plugs in the tube, metallic powder between the plugs, metallic plates connected to the plugs, choking-coils connected to the plugs, and a circuit through the coils, plugs and powder.

20. In a receiver for electrical oscillations, the combination of a tube, metallic plugs in the tube, metallic powder between the plugs, metallic plates connected to the plugs, choking-coils connected to the plugs, a circuit through the coils, plugs and powder, and means, controlled by the circuit, for shaking the powder.

21. In a receiver for electrical oscillations, the combination of a tube, metallic plugs in the tube, a mixture of metallic powder and mercury between the plugs, choking-coils connected to the plugs, a circuit through the coils, plugs and powder, and means, controlled by the circuit, for shaking the powder.

22. In a receiver for electrical oscillations, the combination of an imperfect electrical contact, choking-coils connected to the contact, a circuit through the coils and contact, a relay controlled by the circuit, and means, controlled by the relay, for shaking the contact.

23. In a receiver for electrical oscillations, the combination of an imperfect electrical contact, a circuit through the contact, an electric trembler shaking the contact, and means for preventing the self-induction of the trembler from affecting the contact.

24. The combination of a transmitter capable of producing electrical oscillations or rays of definite character at the will of the operator, and a receiver located at a distance and having a conductor tuned to respond to such oscillations, a variable-resistance medium in circuit with the conductor, whose resistance is altered by the received oscillations, means, controlled by the received oscillations, for restoring the resistance medium to its normal condition after the reception of such oscillations, and means for rendering the received oscillations manifest.

In witness whereof I have hereunto signed my name, at 18 Finch Lane, in the city of London, the 29th day of January, in the year 1901.

GUGLIELMO MARCONI.

In presence of—
SAMUEL FLOOD PAGE,
HUBERT WILLOUGHBY CORBY.

DISCLAIMER.

11,913. Reissue.—*Guglielmo Marconi*, London, England. TRANSMITTING ELECTRICAL IMPULSES AND SIGNALS AND APPARATUS THEREFOR. Patent dated June 4, 1901.

Disclaimer filed March 10, 1906, by the assignee, Marconi Wireless Telegraph Co.

Enters its disclaimer—

"To said first claim."

"The first claim is as follows:

"1. In an apparatus for communicating electrical signals by means of a producer of Hertz oscillations, and a signaling instrument, the combination, in the receiver, of an imperfect electrical contact, a circuit through the contact, and a receiving instrument operated by the influence of such oscillations on said contact, substantially as and for the purpose described."—[*Official Gazette, March 20, 1906.*]